United States Patent [19]

Lim

[11] 4,311,267

[45] Jan. 19, 1982

[54] METHOD OF SCREENING PASTE SOLDER ONTO LEADED HYBRID SUBSTRATES

[75] Inventor: Linda W. Lim, San Mateo, Calif.

[73] Assignee: GTE Automatic Electric Laboratories, Inc., Northlake, Ill.

[21] Appl. No.: 211,953

[22] Filed: Dec. 1, 1980

Related U.S. Application Data

[62] Division of Ser. No. 35,953, May 4, 1979, Pat. No. 4,270,465.

[51] Int. Cl.³ .............................................. B23K 1/12
[52] U.S. Cl. ................................ 228/180 A; 228/248; 29/840; 29/843
[58] Field of Search ............... 228/180 R, 180 A, 248; 29/840, 843; 427/96, 123, 207.1, 375, 376.7, 376.8, 282

[56] References Cited

U.S. PATENT DOCUMENTS

| | | | |
|---|---|---|---|
| 3,402,110 | 9/1968 | Scherrer | 101/127 X |
| 3,516,155 | 6/1970 | Smith | 228/180 A |
| 3,750,252 | 8/1973 | Landman | 228/180 A |
| 3,769,908 | 11/1973 | Griffin | 101/127 |
| 4,132,341 | 1/1979 | Bratschun | 228/180 A |

FOREIGN PATENT DOCUMENTS

| | | | |
|---|---|---|---|
| 721314 | 1/1955 | United Kingdom | 101/170 |

OTHER PUBLICATIONS

IBM Tech. Dis. Bul., vol 14, #3, Aug. 1971, p. 748.

*Primary Examiner*—Shrive P. Beck
*Assistant Examiner*—Richard Bueker
*Attorney, Agent, or Firm*—Russell A. Cannon

[57] ABSTRACT

Paste solder is contact printed onto lead and component pads of a leaded hybrid substrate through holes that are arranged in a plate in the pattern of the pads, a first recess in the solder or top side of the plate extending over the area containing component holes. In order to accommodate lead frames of single in-line packages (SIP), a second recess is formed in the bottom or substrate side of the plate adjacent lead holes that are defined by a plate thickness that is slightly greater than the height of lead tines located on lead pads. In a printing operation, the bottom of the plate is moved into contact with the padded side of the substrate of a SIP, with lead tines on lead pads being located in associated lead holes and the lead frame in the second recess. Paste solder is then squeegeed over the top of the plate for printing solder onto the component and lead pads of the substrate in a single printing operation. The paste is then moved away from the substrate so that components may be placed into paste solder prior to passing the leaded substrate and components thereon through a reflow solder operation for simultaneously soldering component leads and tines to associated pads.

6 Claims, 8 Drawing Figures

METHOD OF SCREENING PASTE SOLDER ONTO LEADED HYBRID SUBSTRATES

This is a division, of application Ser. No. 35,953, filed May 4, 1979, now U.S. Pat. No. 4,270,465.

BACKGROUND OF INVENTION

This invention relates to thick film hybrid manufacturing techniques, and more particularly to a method of contact printing paste solder onto both component and lead pads of a leaded hybrid substrate in a single solder screening operation.

The conventional method of manufacturing thick film hybrid circuits requires two different solder application steps. In the first step, paste solder is printed onto only component pads on a substrate. After component terminals are located in paste solder, the substrate is reflow soldered to electrically connect the components into electrical circuit patterns on it. A lead frame is then mechanically attached to the substrate by pressing tines of leads over one edge of the substrate so that some tines are on lead pads. In the second step, the leads and one edge of the substrate are dipped into molten solder. This manufacturing method requires considerable operator time. Although a dip solder operation can provide a relatively uniform and thin solder coating of lead tines and associated pads, extreme care must be exercised to ensure that a substrate is dipped deep enough into the molten solder to obtain the desired electrical connection without loosening reflow soldered components adjacent the lead pads such that they move or fall into the solder bath. In order to reduce the number of steps such as storage, cleaning, soldering and inspection that are required in fabricating hybrid circuits, an operator will sometimes use a syringe to individually apply paste solder to both component pads and lead pads having tines thereon prior to a single solder reflow operation. Since this method of dispensing paste solder is operator dependent, it requires considerable operator time. Also, it does not result in uniform amounts of solder being consistently applied to the pads. This causes non-uniform solder junctions at lead contacts that do not have consistent levels of shear strength. Non-contact printing of paste solder using a constant thickness metal stencil having apertures therein in the same pattern as pads on substrates has also been tried. This non-contact printing technique is similar to applying paste solder with a syringe and has also been found unsatisfactory.

An object of this invention is the provision of improved method for more consistently applying prescribed amounts of paste solder to lead and component pads on a leaded substrate during a single printing operation so that lead tines and component terminals may be soldered to associated pads in a single reflow solder operation.

SUMMARY OF INVENTION

In accordance with this invention, a method of contact printing paste solder onto lead and component pads on one side of a leaded hybrid substrate in a single screening operation, the pads being arranged in a prescribed pattern on the one side of the substrate with tines of leads pressed over one edge thereof such that first tines contact and extend over associated lead pads, and that second tines contact the other side of the substrate for mechanically attaching leads thereto, comprises the steps of: locating the other side of the leaded hybrid substrate on a platen; locating an apertured plate over the substrate with the bottom of the plate contacting the one side of the substrate and/or conductive lines thereon with apertures aligned with associated pads and first tines located in associated first apertures, the thickness of the area of the plate containing second apertures that are associated with component pads being significantly less than the thickness of the plate adjacent first apertures, the latter thickness being slightly greater than the height that first tines extend above the one side of the substrate; and screening paste solder over the top of the plate and into apertures for depositing it on the pads in a single screening operation.

DESCRIPTION OF DRAWINGS

This invention will be more fully understood from the following detailed descriptions, together with drawing figures that are not drawn to scale, the thickness of some parts being greatly enlarged for clarity of illustration. In the drawings.

DESCRIPTION OF PREFERRED EMBODIMENTS

Figure 1:
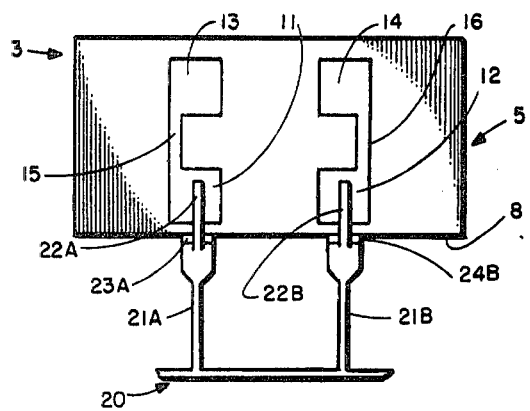
FIG. 1 is a plan view of an inked substrate 5 having pads 11–14 formed on one side 6 thereof with tines on leads 21 pressed over the edge 8 of the substrate and associated lead pads 11 and 12.
Figure 2:
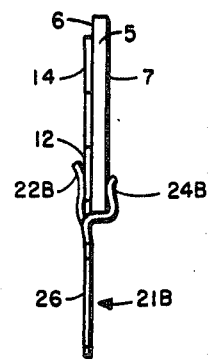
FIG. 2 is a right side elevation view of the leaded substrate 5 in FIG. 1.
Figure 3:
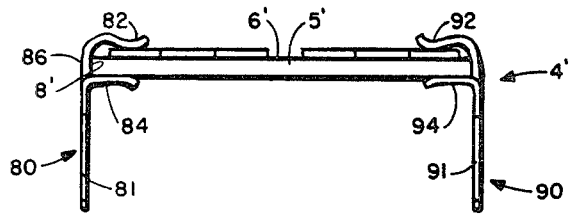
FIG. 3 is an end view of a DIP 4.

Referring now to FIGS. 1 and 2, a relatively simple passive hybrid circuit 3 comprises a ceramic substrate 5 having a plurality of electrically conductive pads 11–14 and lines 15–16 formed on the front 6 thereof by thick film techniques. The substrate 5 is approximately 0.030 inch thick and typically measures from 0.5 inch by 1 inch to 1 inch by 2 inches. The lead pads 11 and 12, located adjacent the bottom edge 8 of the substrate, are connected to associated component pads 13 and 14 by lines 15 and 16. The pads 13 and 14 are spaced apart on the substrate for purposes of component mounting, e.g., a chip capacitor may be connected between them. The pads 11–14 typically measure 0.070 inches by 0.070 inches. A lead frame 20 is mechanically attached to the substrate by pressing tines 22–24 on leads 21 over the edge 8, with tines 22 being centered over and contacting associated ones of the lead pads 11 and 12. The tines 22 are typically 0.010 inch thick and 0.020 inch wide, with the free ends thereof extending approximately 0.030 inch above the side 6 of the substrate. The leads 21 extend below the edge 8 of the substrate with the lead surface 26 about 0.010 inch above the side 6 of the substrate. Since the leads 21 extend parallel to the surface 6 in a line in a common plane, the circuit in FIGS. 1 and 2 is called a SIP or single in-line package 3. A DIP or dual in-line package 4 is shown in FIG. 3 where the two sets of leads 81 and 91 are in associated planes that are generally orthoginal to the side 6' of substrate 5'. The surface 86 of the lead frame 80 here extends only 0.010 inch beyond the edge of the DIP 4.

It is desirable to precisely locate specified amounts of paste solder on pads and tines on lead pads for facilitating making electrical connection of lead tines and terminals of discrete components (not shown) to associated pads in conductive patterns on hybrid circuits 3 and 4 in a single reflow solder operation.

Figure 4:
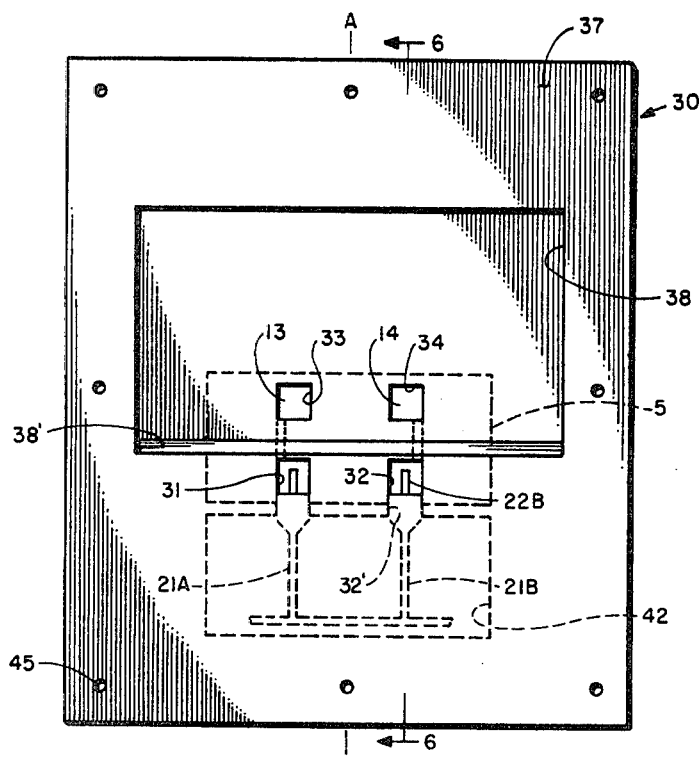
FIG. 4 is a plan view of the solder side 37 of a stencil 30 having centrally located apertures 31–34 in it in the same pattern as pads 11–14 on a substrate 5 there, a first recess 38 in the solder side 37, and a second recess 42 in the substrate side 41.
Figure 6:
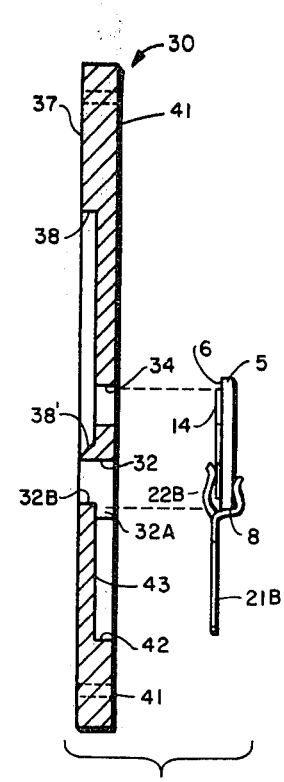
FIG. 6 is a section view of the stencil 30 taken along line 6—6 in FIG. 4, with a leaded substrate 5 located behind it in the same position it would have when the side 6 thereof is located adjacent the side 41 of the stencil in a printing operation.
Figure 5:
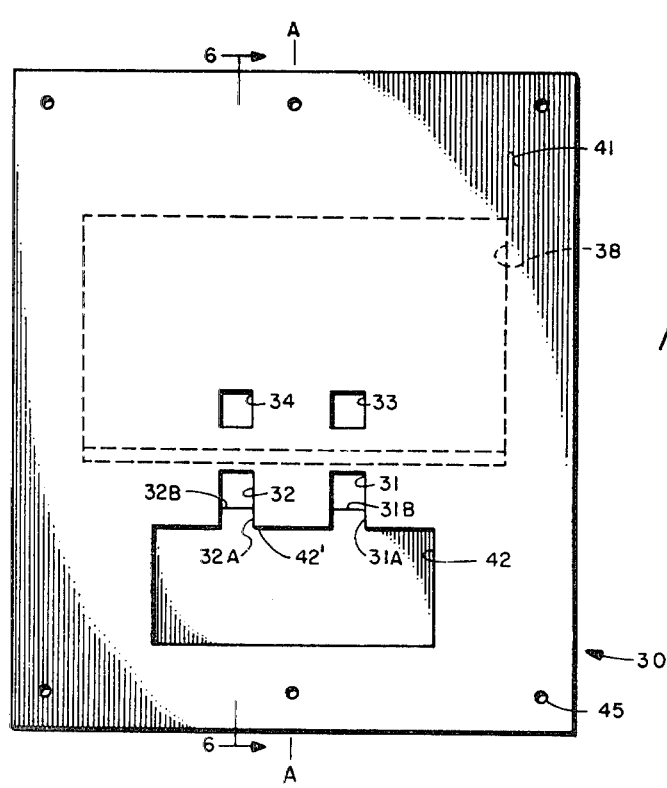
FIG. 5 is a plan view of the substrate side 41 of the stencil 30 when only the stencil is rotated 180° about the centerline A—A in FIG. 4.

A stencil 30 for contact printing paste solder onto pads of a SIP 3 is shown in FIGS. 4-6. The stencil 30 comprises a thin rectangularly shaped plate having a plurality of apertures 31-34 located in the center thereof in the same pattern as pads 11-14 on substrate 5 there. The apertures 33 and 34 are substantially the same size as pads 13 and 14. The apertures 31 and 32 are the same width as and slightly longer than lead pads 11 and 12. The edges 31B and 32B of lead holes 31 and 32 preferably extend slightly below the bottom of pads 11 and 12 but do not extend beyond the edge 8 of the substrate.

The stencil 30 has broad sides 37 and 41 that are flat and parallel, and is preferably made of a 0.032 inch thick sheet of brass that is nickel plated to give it an abrasive resistant surface. The solder side 37 of the stencil has a recess 38 milled in it over the area of the substrate containing component pads. The edge 38' of this recess that is adjacent apertures 31 and 32 is chamfered. In practice, the recess 38 extends over an area of the stencil that is much greater than that of a substrate 5. The depth of the slot 38 is approximately 0.015 inch, which is sufficient to make adhesion between paste solder in apertures 33 and 34 and associated component pads 13 and 14 much greater than the adhesion between this solder and walls of apertures 33 and 34 during a printing operation, as is described more fully hereinafter. The substrate side 41 of the stencil has a slot or recess 42 milled in it over an area that is sufficient for receiving the lead frame 20. It is only necessary that the recess 42 be deep enough to receive the lead frame 20 in it.

Although the edge 42' of this recess is spaced from the lower edges of the lead apertures 31 and 32, the recess 42 extends into the holes 31 and 32 as is shown in FIGS. 5 and 6. The walls such as surfaces 31A and 32A that define narrow slots in FIG. 5 between associated holes 31 and 32 and the large portion of recess 42 extend over the full height of this recess, i.e., from the bottom 43 of recess 42 to the side 41 of the stencil. When the substrate 5 and stencil 30 are brought together for a printing operation (see FIG. 6), the tines 22 are located in associated lead openings 31 and 32, the adjacent portions of leads 21 that project above the side 6 of the substrate resting in the narrow slots 31A and 32A so that the side 41 of the stencil is in contact with conductive traces on the substrate.

The stencil 30 is preferably formed by chemically milling a brass plate from opposite sides thereof. In this manufacturing process, the plate is coated with photoresist and sandwiched between a pair of artwork negatives, one carrying the patterns of the recess 38 and openings 31 and 32, the other carrying the pattern of recess 42 and all four of the openings 31-34. After the sandwiched assembly is exposed with light, the artwork is removed so that the photoresist can be developed and washed to remove unexposed resist under the opaque areas of the film that define the recesses 38 and 42 and openings 31-34. The plate is then placed in a chemical solution for a prescribed time interval for etching away exposed metal from opposite sides of the plate. Where there is no resist on either side of the plate, an opening is etched all the way through the plate. Where there is resist on only one side of the plate, an opening is etched only approximately half way through the plate. Where there is photoresist on both sides of the plate, the material remains 0.032 inch thick after the etching step is completed. It has been found that when the holes 31 and 32 are etched all the way through the plate, the plate is about half its original thickness in the areas of recesses 38 and 42, and the holes 33 and 34 are approximately 0.010 inch bigger in each direction than the area specified in the artwork. Further etching of the plate will result in larger holes and a thinner material in the area of the recesses.

Reference to FIGS. 4-6 reveals that lead pad openings 31 and 32 are etched through small openings in photoresist on both sides of the plate, whereas in forming the component pad holes 33 and 34 the etching solution attacks the side 37 of the plate over the broad area of recess 38. Since it is difficult for the etching solution to continuously circulate into the small holes 31 and 32, etching in these holes 31 and 32 proceeds at a slower rate than does forming of the holes 33 and 34. This difference in etching rates is readily determined by experimentation and is compensated for by adjusting the size of the opaque area associated with areas for holes 33 and 34 in the original artwork. The holes 31 and 32 are preferably as large as practicable for passing a maximum amount of paste solder therethrough since the shear strength of a solder joint is related to the amount of solder attaching a lead to an associated pad on a substrate. The edge 38' of recess 38 is chamfered at approximately 45° prior to nickel plating to provide a smooth transition area over which a squeege travels in a printing operation. Finally, a 0.001 inch thick layer of nickel is plated onto the chemically milled plate to improve its abrasive resistance to paste solder that is rubbed over it.

Figure 7:
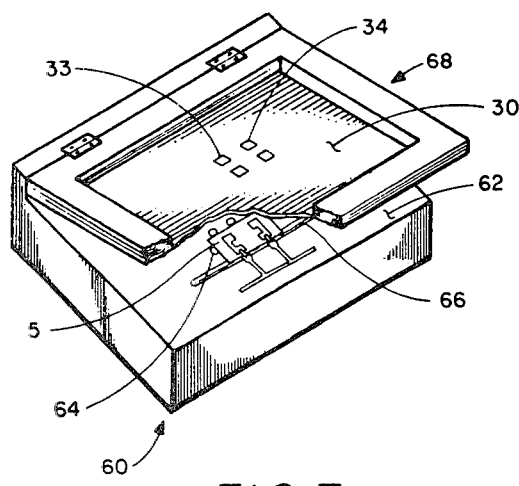
FIG. 7 is a schematic representation of a thick film screen printer 60 having a stencil 30 attached to the underside of a carriage 68 that is shown in its raised position.
Figure 8:
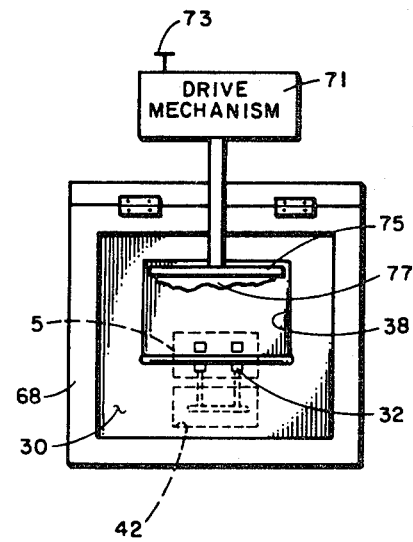
FIG. 8 is a top view of the printer 60 with the carriage 68 rotated adjacent the platen 62 during a printing operation.

FIGS. 7 and 8 are schematic representations of a printer 60 for utilizing the stencil 30 in contact printing paste solder onto hybrid substrates. The printer generally comprises a table having a flat top surface or platen 62 for supporting a substrate 5 during a screening operation and a carriage 68 for supporting the stencil. The substrate 5 is placed over vacuum holes (not shown) in the platen, with adjacent edges of the substrate contacting alignment posts 64 for locating it on the table. The platen 62 has an elongated slot 66 in it for receiving the tines 23 and 24 on the back 7 of the substrate so that it will lay flat on the table. A vacuum is drawn in the holes under the substrate for holding it in place. The stencil 30 has holes 45 around the perimeter thereof (see FIG. 4) for attaching it to the bottom of the carriage 68 with screws (not shown). Alternatively, the stencil may be bonded or welded to a cast aluminum plate that is attached in the conventional manner to the carriage 68. The printer 60 may, by way of example, be a FORSLUND Cermet Printer, model 35-00, manufactured by Hutchinson Industrial Corporation, Hutchinson, Minn. 55350, or an "ami" model CP-88 Thick Film Screen Printer, manufactured by the Presco Division of "affiliated manufacturers, inc.," North Branch, N.J.

In operation, the carriage 68 is rotated to bring the stencil 30 into contact with conductive traces on the side 6 of substrate 5, with tines 22 and adjacent portions of leads 21 nested in associated ones of the lead holes and slots in the stencil. A drive mechanism 71 in FIG. 8 is actuated by pressing a switch 73 for causing squeege 75 to move across the top surface 37 of the stencil for forcing paste solder 77 into openings 31–34 for forcing it into contact with pads 11–14 and tines 22 on the substrate in a single printing operation. Since the openings 33–34 are dimensioned so that adhesion between the solder and pads is greater than that between the solder and walls of these openings, the paste solder remains on the pads 11 to 14 as the substrate 5 and stencil are separated. After the terminals of a discrete component such as a chip capacitor are located in paste solder on pads 13 and 14, all components and leads on the substrate are securely electrically connected in the circuit 3 by a single reflow solder operation.

A stencil 30 that was fabricated and successfully utilized in printing paste solder onto conductive pads and tines of a substrate 5 measuring 1.0 inch wide by 0.5 inch long was chemically milled from a 0.032 inch thick brass plate measuring 8.5 inches wide by 10.5 inches long. The recess 38 measured 2.9 inches wide by 6.0 inches long. The recess 42 measured 3.0 inches long by 0.5 inch wide. The component holes measured 0.070 inch by 0.070 inch, whereas lead holes were 0.070 inch by 0.080 inch. After nickel plating, the recesses 38 and 42 measured 0.015 inch deep and the plate adjacent holes 31 and 32 was 0.034 inch thick.

Although this invention is described in relation to preferred embodiments thereof, variations and modifications will be apparent to those skilled in the art. By way of example, a stencil similar to that in FIGS. 4–6 may be fabricated with two sets of lead holes for use in printing paste solder on pads of the leaded DIP 4 in FIG. 3. Since the lead frames of the DIP extend only 0.010 inch beyond the edge 8' of substrate 5', the recess 42 on the bottom of the stencil may be replaced with an individual recess associated with each lead hole and corresponding to a short length of the narrow slots 31A and 32A in FIGS. 5 and 6. Alternatively, edges of lead holes such as the edges 31B and 32B in a stencil for DIP'S or SIP'S may be extended somewhat beyond the edge 8 of a substrate. Also, the stencil 30 may be fabricated by mechanically machining recesses 38 and 42 in opposite sides thereof, and the stencil may be made of a material other than brass and coated with materials other than nickel for increasing the surface hardness thereof. Further, the size and shapes of the openings in the stencil and pads on the substrate may be varied from that specified here. Also, circuit patterns on substrates will be more complex than that illustrated in FIG. 1. The scope of this invention is therefore to be determined from the attached claims rather than the aforementioned detailed descriptions of preferred embodiments.

What is claimed is:

1. The machine method of contact printing paste solder onto lead pads and component pads on one side of a leaded hybrid substrate in a single printing operation, the pads being arranged in a prescribed pattern on the one side of the substrate with tines of leads pressed over one end thereof such that first tines contact and extend over associated lead pads, and second tines contact the other side of the substrate for mechanically attaching leads thereto, comprising the steps of:

locating the other side of the leaded hybrid substrate on a platen, locating an apertured stencil over the substrate with the bottom of the stencil contacting the one side of the substrate and/or conductive elements thereon, with apertures aligned with associated pads and with first tines located in associated first apertures, the thickness of the area of the stencil containing second apertures that are associated with component pads being significantly less than the thickness of the stencil adjacent first apertures, the latter thickness being slightly greater than the height that first tines extend above the one side of the substrate, and screening paste solder over the top of the stencil and into apertures for depositing it on the pads in a single screening operation, and passing the screened substrate through a solder bath.

2. The method according to claim 1 wherein the stencil is a thin flat plate having a first recess in the top thereof that extends over the area of second apertures that are associated with component pads.

3. The method according to claim 2 wherein the bottom of the plate has elongated slots therein that are adjacent to and extend into associated first apertures for receiving portions of leads of a single in-line package that are connected to associated first tines for enabling conductive lines on the top of the substrate and the bottom of the plate to be in contact in said locating step.

4. The method according to claim 3 including the additional step of separating the plate from the substrate which now has paste solder on pads and first tines, and wherein the bottom of the plate has a second recess for reducing the thickness thereof adjacent first apertures and dimensioned for receiving leads and a connector bar of a single in-line package, the slots extending between associated first apertures and the second recess for enabling locating the top of the substrate and bottom of the plate in substantial contact in said locating step.

5. The method according to claim 2 or 4 including the additional step of locating leads of components in paste solder screened onto component pads of the substrate.

6. The method according to claim 5 including the additional step of passing the leaded substrate and components on the latter through a single reflow solder operation for simultaneously securely electrically connecting the components and tines in an electrical circuit on the substrate.

* * * * *